(12) United States Patent
Chen et al.

(10) Patent No.: US 11,999,041 B2
(45) Date of Patent: Jun. 4, 2024

(54) ELECTRONIC SWITCH MODULE AND ELECTRIC TOOL

(71) Applicant: HUIZHOU TOPBAND ELECTRICAL TECHNOLOGY CO., LTD., Guangdong (CN)

(72) Inventors: Hongyuan Chen, Guangdong (CN); Jian Chen, Guangdong (CN); Shilin Liang, Guangdong (CN); Shuquan Zheng, Guangdong (CN)

(73) Assignee: HUIZHOU TOPBAND ELECTRICAL TECHNOLOGY CO., LTD., Huizhou (CN)

( * ) Notice: Subject to any disclaimer, the term of this patent is extended or adjusted under 35 U.S.C. 154(b) by 385 days.

(21) Appl. No.: 17/424,881

(22) PCT Filed: Feb. 27, 2019

(86) PCT No.: PCT/CN2019/076267
§ 371 (c)(1),
(2) Date: Jul. 21, 2021

(87) PCT Pub. No.: WO2020/151045
PCT Pub. Date: Jul. 30, 2020

(65) Prior Publication Data
US 2022/0088761 A1    Mar. 24, 2022

(30) Foreign Application Priority Data

Jan. 23, 2019  (CN) .......................... 201920117069.0

(51) Int. Cl.
*B25F 5/00*   (2006.01)
*H01H 9/06*   (2006.01)
*H03K 17/96*  (2006.01)

(52) U.S. Cl.
CPC ............... *B25F 5/00* (2013.01); *H01H 9/061* (2013.01); *H03K 17/96* (2013.01)

(58) Field of Classification Search
CPC .......... B25F 5/00; H01H 9/061; H03K 17/96; H01C 10/06; H01C 10/08; H01C 10/20;
(Continued)

(56) References Cited

U.S. PATENT DOCUMENTS 4,817,419 A * 4/1989 Iden ....................... G01L 9/0057
  73/725
4,978,939 A * 12/1990 Zeitvogel ............. H01C 10/305
  338/180

(Continued)

OTHER PUBLICATIONS

International Search Report of PCT Patent Application No. PCT/CN2019/076267 dated Oct. 24, 2019.

*Primary Examiner* — Hemant Desai
*Assistant Examiner* — Mobeen Ahmed

(57) ABSTRACT

The invention is suitable for the technical field of electronic circuits, and provides an electronic switch module and an electric tool. The electronic switch module comprises a variable resistor and a first resistor, wherein the variable resistor and the first resistor form a voltage-dividing resistor unit, and the output end of the module is arranged on a connecting line between the variable resistor and the first resistor; one end of the voltage-dividing resistor unit is connected with a power supply, and the other end is grounded; the variable resistor comprises a plurality of second resistors with different resistance values, a conductive member, a first end and a resistance value adjusting member. When the resistance adjusting member slides along the conducting member, the two second resistors provide three different resistance values, so that the loss of the resistors is reduced, and the lightweight design of the product is facilitated.

20 Claims, 7 Drawing Sheets

(58) Field of Classification Search
CPC ........ H01C 10/23; H01C 10/28; H01C 10/30; H01C 10/38; H01C 10/44
See application file for complete search history.

(56) References Cited

U.S. PATENT DOCUMENTS

| | | | | |
|---|---|---|---|---|
| 5,075,604 A * | 12/1991 | Crook | ................. | H01H 9/061 200/522 |
| 5,198,793 A * | 3/1993 | Leveque | ............. | H05K 1/0284 200/522 |
| 5,334,967 A * | 8/1994 | Paszkiewicz | ........ | H01C 10/08 338/96 |
| 5,554,965 A * | 9/1996 | Sundberg | ............. | H01C 10/38 338/156 |
| 6,285,276 B1 * | 9/2001 | Nedele | ................. | H01C 10/36 338/160 |
| 6,292,090 B1 * | 9/2001 | Higuchi | ............... | H01C 10/36 338/160 |
| 7,002,447 B2 * | 2/2006 | Dedert | ............ | H01C 17/06526 338/33 |
| 7,220,926 B2 * | 5/2007 | Mano | ................... | H01H 15/06 200/16 D |
| 7,652,442 B2 * | 1/2010 | Miyazaki | ............... | H01H 9/30 173/217 |
| 8,071,903 B2 * | 12/2011 | Sato | ..................... | H01H 13/06 200/522 |
| 8,089,019 B2 * | 1/2012 | Inagaki | ................. | H01H 9/04 200/522 |
| 9,508,498 B2 * | 11/2016 | Forster | ................. | B25F 5/001 |
| 9,514,866 B2 * | 12/2016 | Huang | ................. | H01C 10/10 |
| 10,541,588 B2 * | 1/2020 | Wachter | ............... | B25F 5/00 |
| 10,608,501 B2 * | 3/2020 | Ekstrom | ............... | B25F 5/008 |
| 2011/0315530 A1 * | 12/2011 | Xu | ....................... | H01H 13/08 200/279 |
| 2012/0292063 A1 * | 11/2012 | Forster | ................. | H02P 6/14 173/18 |
| 2013/0342187 A1 * | 12/2013 | Hozoi | ................... | H01C 13/02 324/120 |
| 2018/0323735 A1 * | 11/2018 | Kong | .................. | H01C 10/30 |
| 2018/0342928 A1 * | 11/2018 | Ekstrom | ............... | B25F 5/008 |
| 2022/0084759 A1 * | 3/2022 | Liang | ................. | H01H 15/005 |
| 2022/0161409 A1 * | 5/2022 | Liang | ...................... | B25F 5/02 |

* cited by examiner

ELECTRONIC SWITCH MODULE AND ELECTRIC TOOL

BACKGROUND OF THE INVENTION

1. Technical Field

The invention belongs to the technical field of electronic circuits, and particularly relates to an electronic switch module and an electric tool.

2. Description of Related Art

With the development of science and technology, more and more electric tools come into people's daily work and life, and bring people a lot of convenience, such as electric drill, electric saw, electric screwdriver, electric mower and so on.

Existing electric tools generally contain an electronic switch module for adjusting the speed of the electric tool so that the user can adjust the operating speed of the electric tool as desired. The existing speed-regulating switch realizes the regulation of the resistance value by changing the number of the resistors connected in series in a circuit through the sliding of a scribe, and further changes the running current of an electric tool to realize the speed-regulating function.

However, according to the speed regulation method of the electric tool, a resistor needs to be correspondingly arranged when each gear is regulated, so that the number of the required resistors is large, which is not beneficial to the lightweight design of a product; and the number of adjustable gears is consistent with that of resistors, so that the adjustable gears are small under the condition of the same number of resistors.

BRIEF SUMMARY OF THE INVENTION

The embodiment of the invention provides an electronic switch module, and aims to solve the problem that a plurality of resistors are consumed because a resistor needs to be correspondingly arranged in one gear of the existing electronic switch module.

The embodiment of the invention is realized as follows: the electronic switch module comprises a variable resistor and a first resistor, wherein the variable resistor and the first resistor are connected in series to form a voltage-dividing resistor unit, and an output end of the module is arranged on a connecting line between the variable resistor and the first resistor; one end of the voltage-dividing resistor unit is connected with a power supply, and one end is grounded; the variable resistor comprises a plurality of second resistors with different resistance values, a conductive member and a resistance adjusting member with a first end electrically connected with the conductive member in a sliding way; and when the resistance adjusting member slides along the conductive member, the second end of the resistance adjusting member is electrically connected with one or two second resistors.

Furthermore, one end of each second resistor is provided with an electric contact member, and the plurality of electric contact members are uniformly arranged along the sliding direction of the resistance adjusting member at intervals.

Furthermore, the plurality of electric contact members are arranged in parallel along the sliding direction of the resistance adjusting member.

Furthermore, two electric contact points are arranged at a second end of the resistance adjusting member at intervals, and when the resistance adjusting member slides along the conductive member, the two electric contact points are electrically connected with one or two electric contact members of the second resistor.

Furthermore, an included angle between a connecting line of the two electric contact points at the second end of the resistance adjusting member and the side edge of the electric contact member is greater than 0° degree and less than 180°.

Furthermore, a first pin and a second pin with different lengths are arranged at the second end of the resistance adjusting member, and the two electrical contact points are respectively arranged at the end parts of the first pin and the second pin.

Furthermore, the second end of the resistance adjusting member is provided with two third pins with the same length, and the two electric contact points are respectively arranged at the end parts of the two third pins.

Furthermore, the module also comprises a capacitor used for filtering, one end of the capacitor is grounded, and the other end of the capacitor is connected with the output end of the module.

Furthermore, the module also comprises a printed board, and the variable resistor and the first resistor are fixedly arranged on the printed board.

Another object of embodiments of the present invention is to provide an electric tool including the electronic switch module.

An electric tool includes the electronic switch module of any one of the above.

In the embodiment of the invention, a plurality of second resistors with different resistance values are arranged, when one end of the resistance adjusting member is connected with the conducting member and the other end of the resistance adjusting member is connected with different second resistors, resistance value adjustment can be realized, and when the resistance adjusting member slides along the conduct member until the second end of the resistance adjusting member is connected with a single second resistors, the output resistor is the resistance value of a single second resistors, and when the resistance adjusting member slides along the conduct member until the second end of the resistance adjusting member is connected with two adjacent second resistors, the output resistor is the resistance value of two adjacent second resistors connected in parallel, so that three different resistance values are provided by the two second resistors, namely three gears can be adjusted by the two resistors; and under the same gear requirement, the loss of the resistor is reduced through the design, so that the lightweight design of a product is facilitated.

DETAILED DESCRIPTION OF THE INVENTION

In order to make the objects, technical schemes and advantages of the present invention more clearly understood, the present invention will be further described in detail with reference to the accompanying drawings and examples. It should be understood that the specific embodiments described herein are merely illustrative of the present invention and are not intended to be limiting of the present invention.

In the embodiment of the invention, a plurality of second resistors with different resistance values are arranged, when one end of a resistance adjusting member is connected with a conducting member and the other end of a resistance adjusting member is connected with different second resistors, resistance value adjustment can be realized, and when the resistance adjusting member slides along the conduct member until the second end of the resistance adjusting member is connected with a single second resistor, the output resistor is the resistance value of a single second resistor, and when the resistance adjusting member slides along the conduct member until the second end of the resistance adjusting member is connected with two adjacent second resistors, the output resistor is the resistance value of two adjacent second resistors connected in parallel, so that three different resistance values are provided by the two second resistors, namely three gears can be adjusted by the two resistors; and under the same gear requirement, the loss of the resistor is reduced through the design, so that the lightweight design of a product is facilitated.

Embodiment 1

Figure 1:
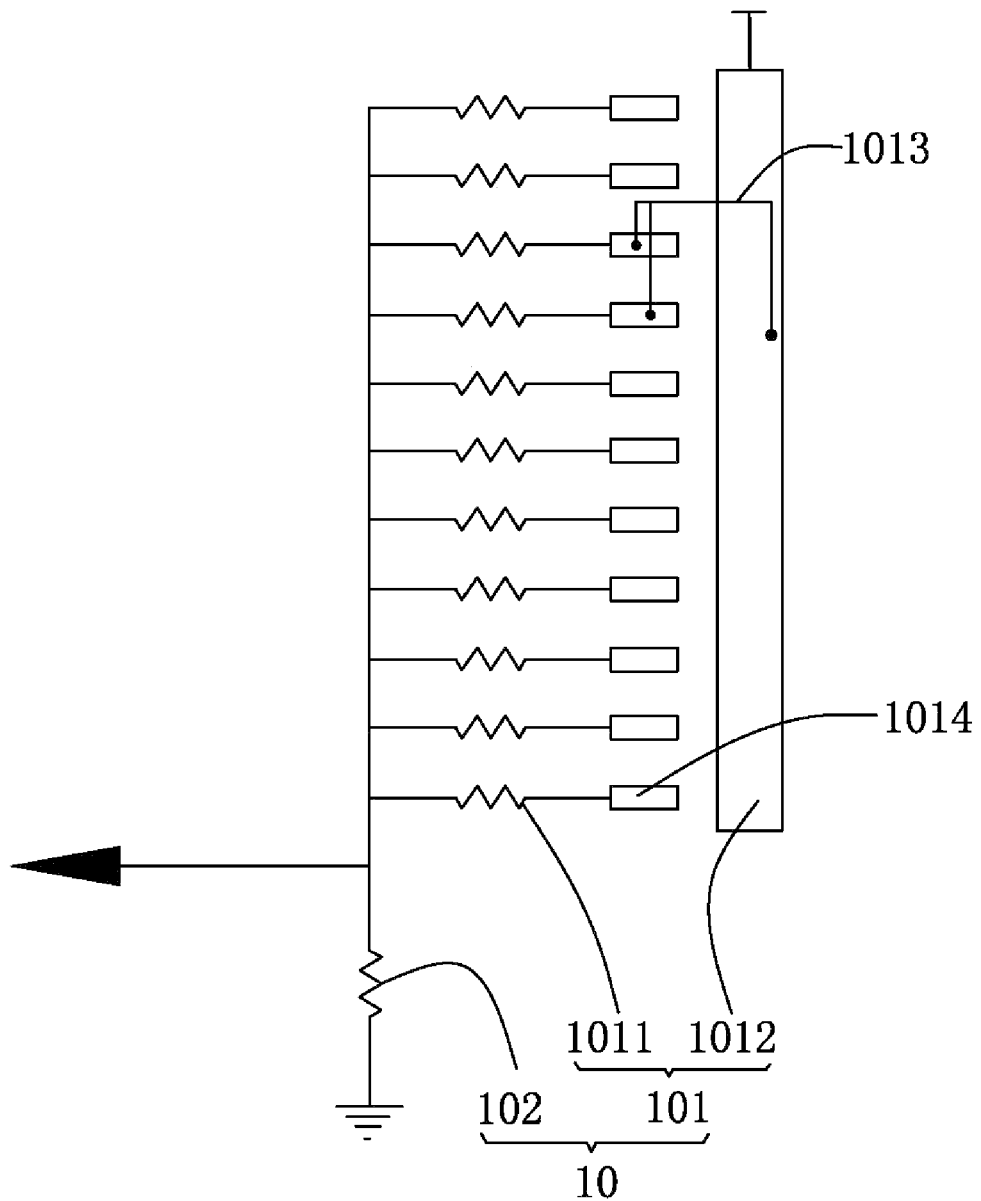
FIG. 1 is a schematic structural diagram of an electronic switch module according to embodiment 1 of the present invention.

Referring to FIG. 1, an electronic switch module according to an embodiment of the present invention includes a variable resistor 101 and a first resistor 102, the variable resistor 101 and the first resistor 102 are connected in series to form a voltage-dividing resistor unit 10.

Specifically, the output end of the module is arranged on a connecting line between the variable resistor 101 and the first resistor 102; one end of the voltage-dividing resistor unit 10 is connected with a power supply, and the other end is grounded; the variable resistor 101 includes a plurality of second resistors 1011 with different resistances, a conductive member 1012, and a resistance adjusting member 1013 having a first end electrically connected to the conductive member 1012 in a sliding manner; when the resistance adjusting member 1013 slides along the conductive member, a second end of the resistance adjusting member 1013 is electrically connected to one or two of the second resistors 1011. The conductive member 1012 is made of copper strip, copper sheet, or other conductive metal, and is mainly used for conduction. The specific material and shape are not limited herein.

Figure 2:
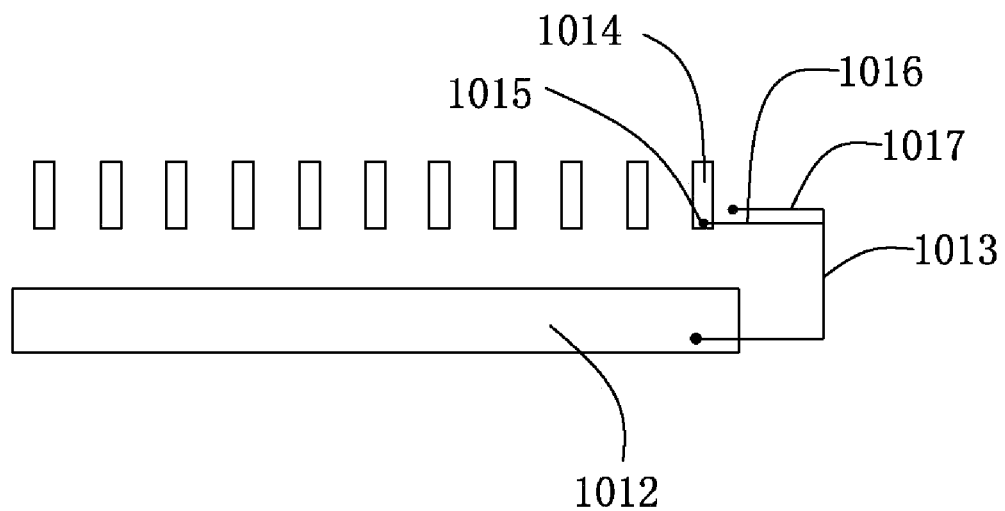
FIG. 2 is a schematic diagram of a first operating state of a variable resistor in an electronic switch module according to a second embodiment of the present invention.
Figure 3:
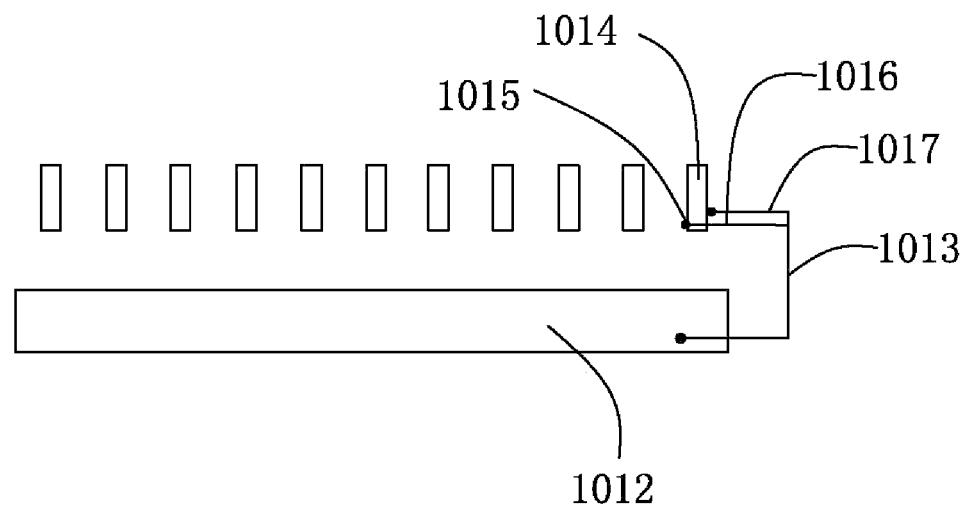
FIG. 3 is a schematic diagram of a second operating state of the variable resistor of FIG. 2.
Figure 4:
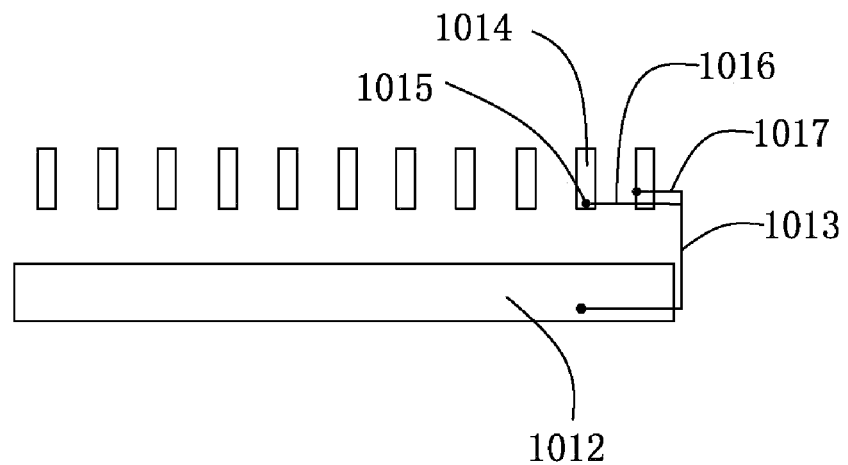
FIG. 4 is a schematic diagram of a third operating state of the variable resistor of FIG. 2.
Figure 5:
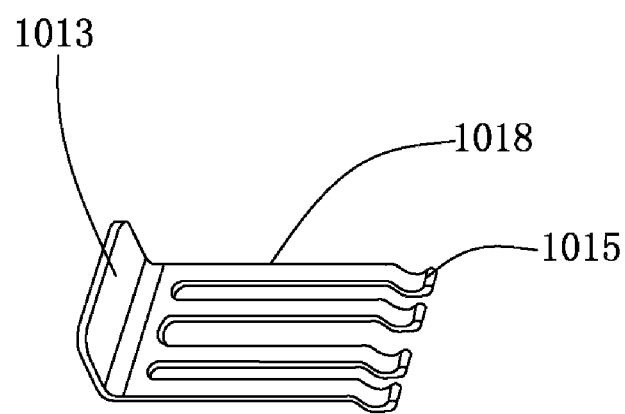
FIG. 5 is a schematic diagram of a partial structure of a resistance adjusting member in an electronic switch module according to a third embodiment of the present invention.
Figure 6:
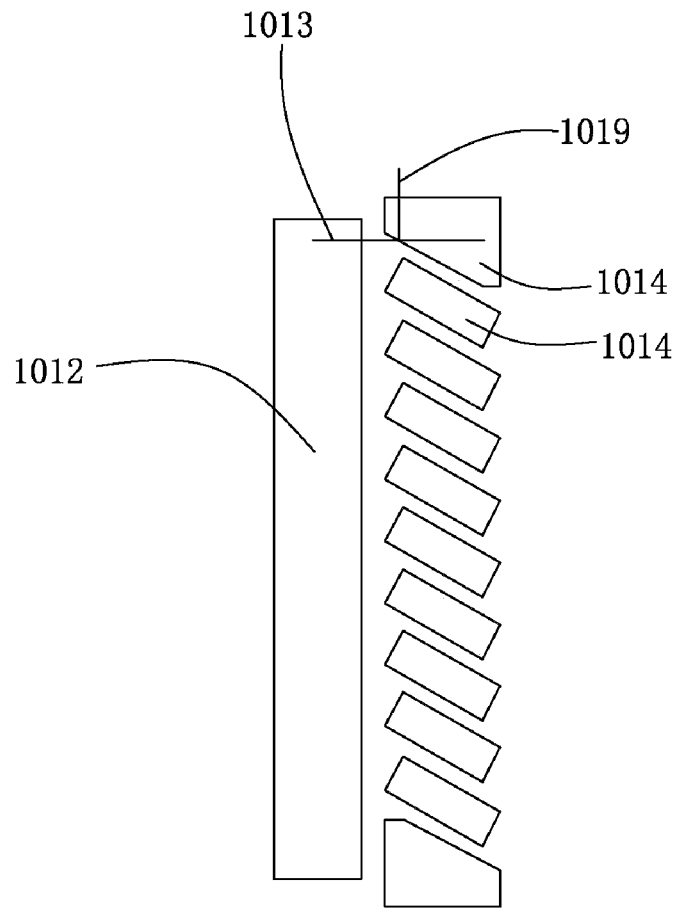
FIG. 6 is a schematic diagram of a first operating state of the variable resistor in the electronic switch module in a third embodiment of the present invention.
Figure 7:
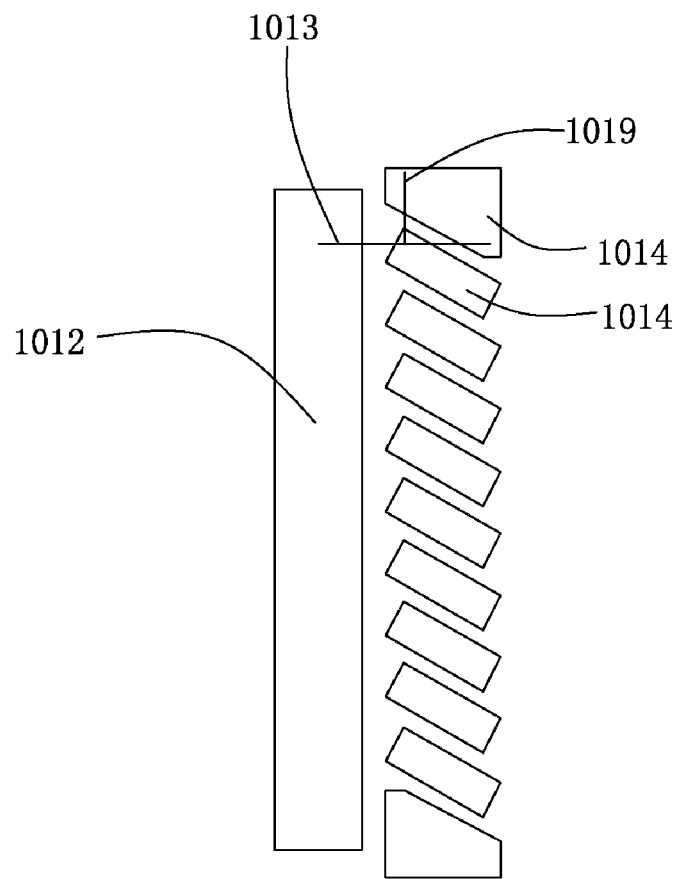
FIG. 7 is a schematic diagram of a second operating state of the variable resistor of FIG. 6.
Figure 8:
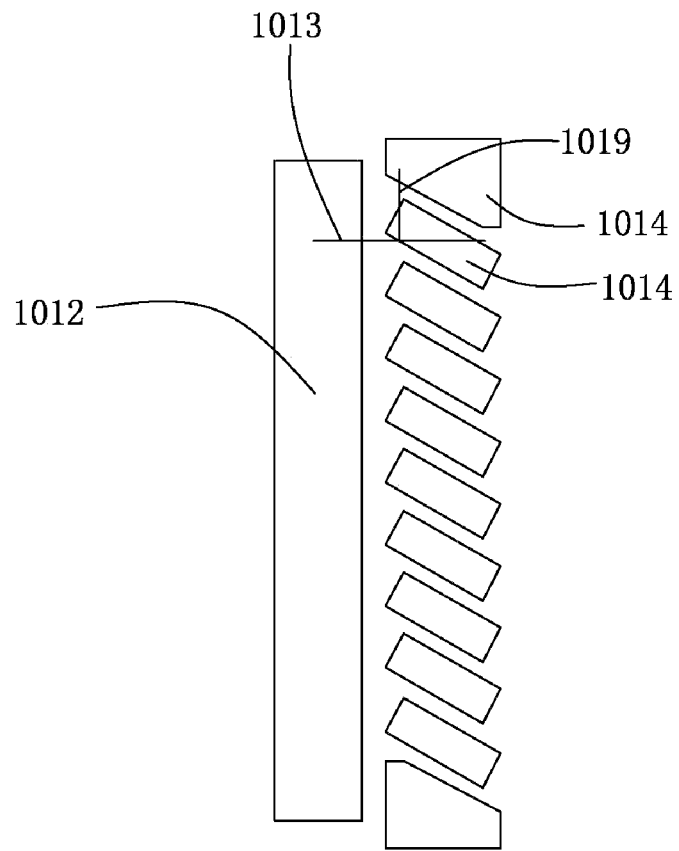
FIG. 8 is a schematic diagram of a third operating state of the variable resistor of FIG. 6.

The embodiment of the invention is realized as follows: by arranging a plurality of second resistors 1011 with different resistance values, when one end of the resistance adjusting member 1013 is connected with the conducting member 1012, and the other end of the resistance adjusting member 1013 is connected with the different second resistors 1011, resistance value adjustment can be realized, When the resistance value adjusting member 1013 slides along the conductive member 1012 until the second end thereof is connected to the single second resistor 1011, as shown in FIGS. 2 and 3, the output resistance is the resistance value of the single second resistor 1011, and the obtained output voltage is $$V_{out} = V_{cc} \times \frac{R_{102}}{R_n + R_{102}},$$

when the resistance value adjusting member 1013 slides along the conductive member 1012 until the second end thereof is connected with two adjacent second resistors 1011, as shown in FIG. 4, the output resistance is the resistance value of two adjacent second resistors connected in parallel. The obtained output voltage is $$V_{out} = V_{cc} \times \frac{R_{102}}{(R_n // R_{n+1}) + R_{102}},$$

and provides three different resistance values for realizing the two second resistors 1011, that is, the two resistors can be adjusted to three gears, under the same gear requirements, the above design reduces the loss of resistors, which is conducive to the lightweight design of products.

Embodiment 2

Referring to FIG. 2 to FIG. 4, the voltage voltage-dividing resistor unit 10 in the electronic switch module according to the embodiment of the present invention is different from the first embodiment in that, in a specific implementation process, in order to facilitate the contact between the second resistor 1011 and the resistance adjusting member 1013 to realize the electrical connection there between, an electrical contact member 1014 may be provide at one end of each of that second resistors 1011, the plurality of electrical contact members 1014 are evenly spaced along the sliding direction of the resistance adjusting member 1013. So that the resistance adjusting member 1013 is connected to the electrical contact of the second resistor 1011. The shape of the electrical contact 1014 may be rectangular, triangular, parallelogram, circular, etc and the specific shape is not limited herein.

Specifically, in order to facilitate the electronic adjusting member 1013 to contact with the electrical contact members 1014 on the second resistor 1011, the electrical contact members 1014 are arranged in parallel along the sliding direction of the resistance adjusting member 1013.

Accordingly, in order to facilitate the contact between the resistance adjusting member 1013 and the second resistor 1011, two electrical contact points 1015 are arranged at the second end of the resistance adjusting member 1013 at intervals. When the resistance adjusting member 1013 slides along the conductive member 1012, the two electrical contact points 1015 are electrically connected to one or two electrical contact members 1014 of the second resistor 1011, so that the resistance adjusting member 1013 is more conveniently contacted with the electrical contact members 1014 of the second resistor 1011.

Specifically, in this embodiment, in order to enable the resistance adjusting member 1013 to realize three different connection modes with two adjacent second resistors 1011, the included angle between the connecting line of the two electrical contact points 1015 at the second end of the resistance adjusting member 1013 and the side of the electrical contact member 1014 is greater than 0° and less than 180°. The connecting lines of the two electrical contact points 1015 at the second end of the resistance adjusting member 1013 are not parallel to the side edges of the electrical contact members 1014, so that the resistance adjusting member 1013 can be connected with a single second resistor 1011 alone or two adjacent second resistors 1011 simultaneously.

In order to realize the above connection mode, in the embodiment of the present invention, a first pin 1016 and a second pin 1017 with different lengths may be disposed at the second end of the resistance adjusting member 1013, and the two electric contact points 1015 are respectively disposed at the ends of the first pin 1016 and the second pin 1017. The electrical contact members 1014 of the second resistors 1011 are arranged in parallel, so that the resistance adjusting member 1013 can be connected to two adjacent second resistors 1011 in three different ways.

Embodiment 3

Referring to FIG. 5 to FIG. 8, the voltage-dividing resistor unit 10 in the electronic switch module according to an embodiment of the present invention is different from the first embodiment in that, in order to electrically connect the resistance adjusting member 1013 with the second resistor 1011, two third pins 1018 with the same length are provided at the second end of the resistance adjusting member 1013. So that the resistance adjusting member 1013 is connected to the conductive member 1012, and the two electric contact points 1015 are respectively arranged at the end parts of the two third pins 1018, and the electric contact members 1014 of the second resistors 1011 are arranged in an inclined and parallel manner, so that the resistance adjusting member 1013 can be connected with two adjacent second resistors 1011 in three different connection modes; and through an inverted T-shaped non-conductive handle 1019, to push the resistance adjusting member 1013 to move.

Embodiment 4

Figure 9:
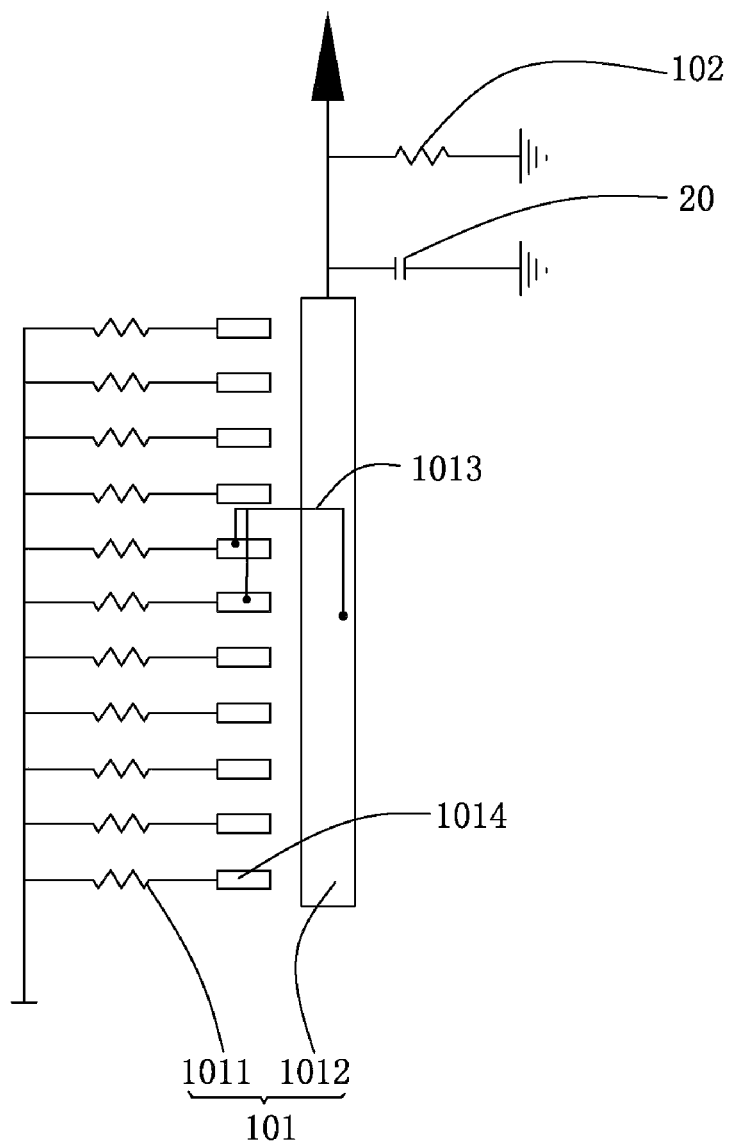
FIG. 9 is a schematic structural diagram of an electronic switch module according to a fourth embodiment of the present invention.

Referring to FIG. 9, an electronic switch module is provided according to an embodiment of the present invention. The difference between the fourth embodiment and the first embodiment is that, in the fourth embodiment, the module further includes a capacitor 20 for filtering, one end of the capacitor 20 is grounded, and the other end of the capacitor 20 is connected to the output end of the module, so as to stabilize the output voltage of the electronic switch module.

Specifically, in the implementation process of the present invention, the positions of the variable resistor 101 and the first resistor 102 can be interchanged, for example, the variable resistor 101 is connected to a power supply and the first resistor 102 is grounded, or the first resistor 102 is connected to a power supply and the variable resistor 101 is grounded. Therefore, in this embodiment, the capacitor 20 and the first resistor 102 may be disposed at one end of the conductive member 1012.

In another embodiment of the present invention, the module further comprises a printed board, the variable resistor 101 and the first resistor 102 are fixedly arranged on the printed board, and the conductive member 1012 and the electrical contact member 1014 are copper sheets printed on the printed board to form a printed board product with a speed regulation function.

Embodiment 5

In one embodiment of the invention, an electric tool containing the electronic switch module can be provided, which comprises any one of the electronic switch modules as the above, such as the speed regulation of an electric drill, an electric saw, an electric screwdriver, and an electric lawn mower, and a speed regulation handle is pushed or rotated by arranging any one of the electronic switch modules as the above, and that resistance adjust member 1013 can be connected with different second resistor 1011, under the condition of the same number of resistors, the multi-stage speed change of the electric tool can be realized, the user experience is improved, and simultaneously, the number of the second resistors 1011 can be reduced under the requirement of the same speed regulation gear, which is beneficial to the lightweight design of a product. The above description is merely illustrative of the preferred embodiments of the present invention, and is not intended to limit the present invention. Any and all modifications, equivalents, substitutions and improvements within the spirit and principle of the invention are intended to be encompassed by the invention.

What is claimed is:

1. An electronic switch module, wherein the module comprises a variable resistor and a first resistor, the variable resistor and the first resistor are connected in series to form a voltage-dividing resistor unit, and the output end of the module is arranged on a connecting line between the variable resistor and the first resistor;

one end of the voltage-dividing resistor unit is connected with a power supply, and one end is grounded;

the variable resistor comprises a plurality of second resistors with different resistance values, a conductive member and a resistance adjusting member, wherein a first end of the resistance adjusting member is electrically connected with the conductive member in a sliding way;

and when that resistance adjusting member slides along the conductive member, the second end of the resistance adjusting member is electrically connected with one or two second resistors; one end of each of the second resistors is directly connected to the first resistor, and the other end of each of the second resistors is provided with an electric contact member and is capable of being electrically connected to the second end of the resistance adjusting member through the corresponding electric contact member; when the resistance adjusting member slides to a position where the second end of the resistance adjusting member is connected with two electric contact members of two adjacent second resistors, an output of the resistance adjusting member is a resistance value of the two adjacent second resistors connected in parallel.

2. The electronic switch module according to claim 1, wherein the plurality of electric contact members are uniformly arranged along the sliding direction of the resistance adjusting member at intervals.

3. The electronic switch module according to claim 2, wherein the plurality of electrical contact members are arranged in parallel along the sliding direction of the resistance adjusting member.

4. The electronic switch module according to claim 3, wherein the second end of the resistance adjusting member is provided with two electric contact points at intervals, and when the resistance adjusting member slides along the conductive member, the two electric contact points are electrically connected with one or two electric contact members of the second resistor.

5. The electronic switch module according to claim 4, wherein an included angle between a connecting line of the two electrical contact points at the second end of the resistance adjusting member and the side edge of the electrical contact member is greater than 0° and less than 180°.

6. The electronic switch module according to claim 5, wherein a first pin and a second pin with different lengths are arranged at the second end of the resistance adjusting member, and the two electric contact points are respectively arranged at the ends of the first pin and the second pin.

7. The electronic switch module of claim 5, wherein the second end of the resistance adjusting member is provided with two third pins having the same length, and the two electric contact points are respectively arranged at the ends of the two third pins.

8. The electronic switch module according to claim 2, wherein the second end of the resistance adjusting member is provided with two electric contact points at intervals, and when the resistance adjusting member slides along the conductive member, the two electric contact points are electrically connected with one or two electric contact members of the second resistor.

9. The electronic switch module according to claim 8, wherein an included angle between a connecting line of the two electrical contact points at the second end of the resistance adjusting member and the side edge of the electrical contact member is greater than 0° and less than 180°.

10. The electronic switch module according to claim 9, wherein a first pin and a second pin with different lengths are arranged at the second end of the resistance adjusting member, and the two electric contact points are respectively arranged at the ends of the first pin and the second pin.

11. The electronic switch module of claim 9, wherein the second end of the resistance adjusting member is provided with two third pins having the same length, and the two electric contact points are respectively arranged at the ends of the two third pins.

12. The electronic switch module according to claim 1, wherein the module further comprises a capacitor for filtering, one end of the capacitor is grounded, and the other end of the capacitor is connected to the output end of the module.

13. The electronic switch module according to claim 12, wherein the module further comprises a printed board, and the variable resistor and the first resistor are fixedly arranged on the printed board.

14. The electronic switch module according to claim 1, wherein the module further comprises a printed board, and the variable resistor and the first resistor are fixedly arranged on the printed board.

15. An electric tool, wherein comprising the electronic switch module described in claim 1.

16. The electric tool of claim 15, wherein the plurality of electric contact members are uniformly arranged along the sliding direction of the resistance adjusting member at intervals.

17. The electric tool of claim 16, wherein the plurality of electrical contact members are arranged in parallel along the sliding direction of the resistance adjusting member.

18. The electric tool of claim 16, wherein the second end of the resistance adjusting member is provided with two electric contact points at intervals, and when the resistance adjusting member slides along the conductive member, the two electric contact points are electrically connected with one or two electric contact members of the second resistor.

19. The electric tool of claim 18, wherein an included angle between a connecting line of the two electrical contact points at the second end of the resistance adjusting member and the side edge of the electrical contact member is greater than 0° and less than 180°.

20. The electric tool of claim 19, wherein a first pin and a second pin with different lengths are arranged at the second end of the resistance adjusting member, and the two electric contact points are respectively arranged at the ends of the first pin and the second pin.

* * * * *